(12) United States Patent
Huang et al.

(10) Patent No.: US 9,042,417 B2
(45) Date of Patent: May 26, 2015

(54) PHOTONIC DEVICE STRUCTURE AND FABRICATION METHOD THEREOF

(71) Applicant: SiFotonics Technologies Co., Ltd., Woburn, MA (US)

(72) Inventors: Mengyuan Huang, Beijing (CN); Liangbo Wang, Beijing (CN); Wang Chen, Beijing (CN); Ching-yin Hong, Lexington, MA (US); Dong Pan, Andover, MA (US)

(73) Assignee: SiFotonics Technologies Co., Ltd., Woburn, MA (US)

( * ) Notice: Subject to any disclaimer, the term of this patent is extended or adjusted under 35 U.S.C. 154(b) by 0 days.

(21) Appl. No.: 14/079,318

(22) Filed: Nov. 13, 2013

(65) Prior Publication Data

US 2014/0133508 A1     May 15, 2014

Related U.S. Application Data

(60) Provisional application No. 61/796,465, filed on Nov. 13, 2012.

(51) Int. Cl.
| | |
|---|---|
| H01S 5/00 | (2006.01) |
| H01L 31/18 | (2006.01) |
| H01L 31/0232 | (2014.01) |
| H01S 5/20 | (2006.01) |
| H01S 5/22 | (2006.01) |
| H01S 5/183 | (2006.01) |

(52) U.S. Cl.
CPC ............ *H01L 31/18* (2013.01); *H01L 31/0232* (2013.01); *H01S 5/2004* (2013.01); *H01S 5/2018* (2013.01); *H01S 5/2205* (2013.01); *H01S 5/20* (2013.01); *H01S 5/18325* (2013.01); *H01S 5/18341* (2013.01); *H01S 5/2059* (2013.01)

(58) Field of Classification Search
CPC ... H01S 5/2004; H01S 5/2018; H01S 5/2205; H01S 5/2059; H01S 5/20
USPC ............................... 372/45.01, 46.01, 46.015
See application file for complete search history.

(56) References Cited

U.S. PATENT DOCUMENTS

| | | | | |
|---|---|---|---|---|
| 5,115,443 | A * | 5/1992 | Miyazawa | ................ 372/46.01 |
| 5,974,069 | A * | 10/1999 | Tanaka et al. | ............. 372/46.01 |
| 6,185,238 | B1 * | 2/2001 | Onomura et al. | .......... 372/46.01 |

* cited by examiner

*Primary Examiner* — Kinam Park
(74) *Attorney, Agent, or Firm* — Han IP Corporation (57) ABSTRACT

Various embodiments of a photonic device and fabrication method thereof are provided. In one aspect, a device includes a substrate, a current confinement layer disposed on the substrate, an absorption layer disposed in the current confinement layer, and an electrical contact layer disposed on the absorption layer. The current confinement layer is doped in a pattern and configured to reduce dark current in the device. The photonic device may be a photodiode or a laser.

23 Claims, 7 Drawing Sheets

PHOTONIC DEVICE STRUCTURE AND FABRICATION METHOD THEREOF

CROSS-REFERENCE TO RELATED PATENT APPLICATIONS

This application is the non-provisional application of, and claims the priority benefit of U.S. Patent Application Nos. 61/796,465, filed on Nov. 13, 2012 and entitled "Method for Confining Current Through GeSi Photonic Devices", which is herein incorporated by reference in its entirety.

BACKGROUND

1. Technical Field

The present disclosure relates to photonic devices and, more particularly, to confining current in photonic devices.

2. Description of Related Art

Figure 7:
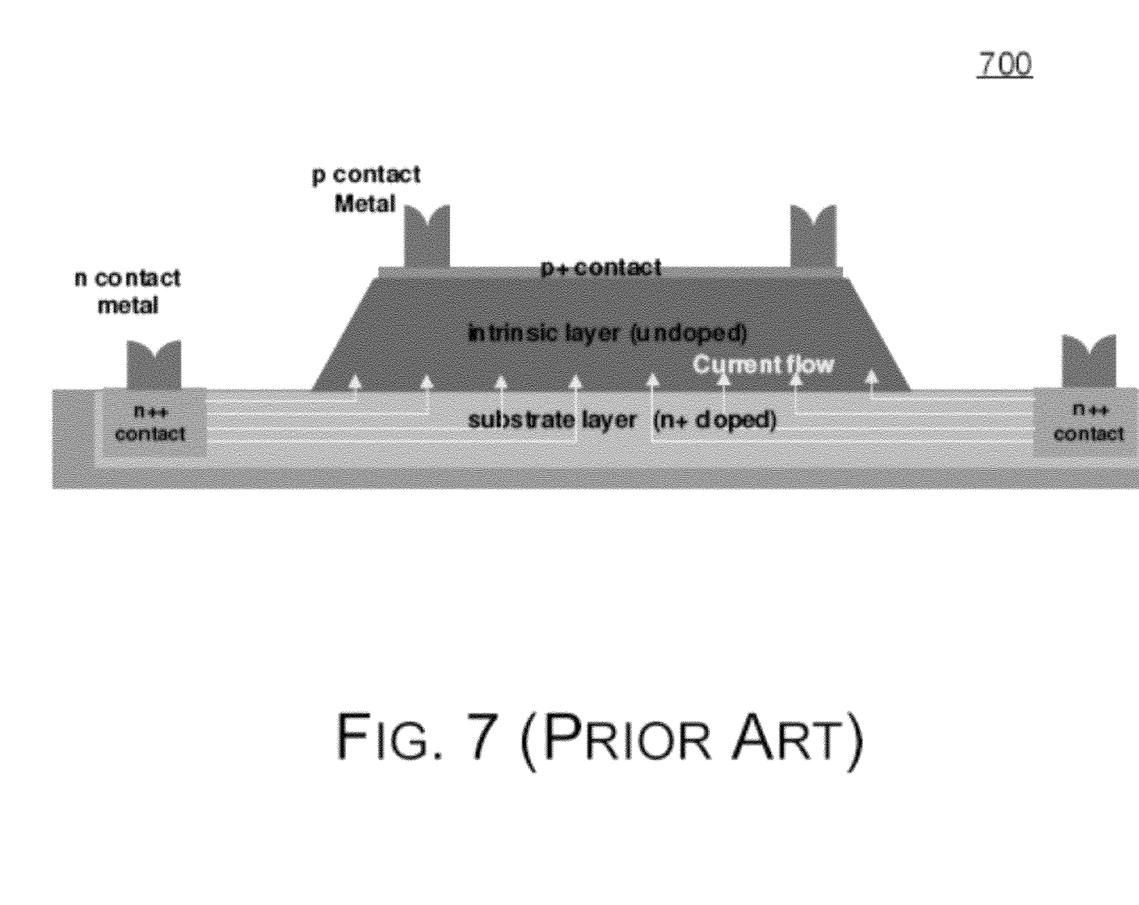
FIG. 7 is a structural diagram of a conventional photodiode device.

Typically the substrate layers in many conventional photonic devices are uniformly and heavily doped in order to reduce series resistance and/or to improve electrical connection, especially for high-speed optical communication applications. As a result, conductive currents can cross the entire interface between the photonic device and substrate, as illustrated in FIG. 7.

However, not all the conductive currents are useful for device operation, and current from certain region even causes negative impact on device performance of the photonic device. For example, for a photonic device the useful region is the central region under coupling aperture for normal incident light. Accordingly, those conductive currents crossing other regions are regarded as noise that hampers device performance. This condition tends to worsen especially when the photonic device has a large sidewall leakage current. Thus, there is a need to solve the aforementioned problems.

SUMMARY

In one embodiment, the method may further include forming an optical barricade layer that at least partially surrounds the second semiconductor structure such that an optical coupling region of the second semiconductor structure is covered by the optical barricade layer to avoid the second semiconductor structure receiving the optical signal.

In one aspect, a device may include: a substrate; a current confinement layer disposed on the substrate, the current confinement layer being doped in a pattern and configured to reduce dark current in the device; an absorption layer disposed on the current confinement layer; and an electrical contact layer disposed on the absorption layer and doped with dopants of a first polarity.

In one embodiment, a first portion of the current confinement layer may be doped with dopants of a second polarity opposite the first polarity, and a second portion of the current confinement layer surrounding the first portion may include an intrinsic region.

In one embodiment, the first portion of the current confinement layer may be doped with dopants of the second polarity with a doping concentration from about $1\times10^{16}$ to about $1\times10^{20}/cm^3$.

In one embodiment, the second portion of the current confinement layer may be doped with dopants of the second polarity with a doping concentration has a doping concentration less than $1\times10^{16}/cm^3$.

In one embodiment, a first primary side of the substrate may include a recess, and the current confinement may be disposed on the first primary side of the substrate in the recess.

In one embodiment, an exposed surface of the electrical contact layer may be approximately flush with a portion of the first primary side of the substrate that is not recessed.

In one embodiment, the substrate may be made from a bulk Si wafer a silicon-on-insulator (SOI) wafer.

In one embodiment, a region on a side of the substrate on which the current confinement layer is disposed may be doped with dopants of a second polarity opposite the first polarity to form a doped layer in the substrate.

In one embodiment, the current confinement layer may be made from material growth of Si, GeSi, Ge or a III-V material on the substrate.

In one embodiment, the absorption layer may be made from material growth of Si, GeSi, Ge or a III-V material on the current confinement layer.

In one embodiment, the device may be a normal incident photodiode or a waveguide photodiode.

In one embodiment, the device may be an edge-emitting laser or a vertical cavity surface emitting laser (VCSEL).

In another aspect, a method of fabrication of a device may include: forming a current confinement layer on a substrate, the current confinement layer being doped in a pattern and configured to reduce dark current in the device; forming an absorption layer on the current confinement layer; and forming an electrical contact layer on the absorption layer and doped with dopants of a first polarity.

In one embodiment, forming the current confinement layer on the substrate may include doping the current confinement layer such that a first portion of the current confinement layer with dopants of a second polarity opposite the first polarity.

In one embodiment, the first portion of the current confinement layer may be doped with dopants of the second polarity with a doping concentration from about $1\times10^{16}$ to about $1\times10^{20}/cm^3$.

In one embodiment, a second portion of the current confinement layer surrounding the first portion may be doped with dopants of the second polarity with a doping concentration has a doping concentration less than $1\times10^{16}/cm^3$.

In one embodiment, the method may further include etching a recess on a first primary side of the substrate, where forming the current confinement layer on the substrate may include forming the current confinement layer on the first primary side of the substrate in the recess.

In one embodiment, the substrate may be made from a bulk Si wafer a SOI wafer.

In one embodiment, the method may further include doping a region on a side of the substrate on which the current confinement layer is disposed with dopants of a second polarity opposite the first polarity to form a doped layer in the substrate.

In one embodiment, the method may form the current confinement layer on the substrate by causing material growth of Si, GeSi, Ge or a III-V material on the substrate. In one embodiment, causing material growth may include causing an epitaxial process by RPCVD, UHV/CVD or MOCVD.

In one embodiment, the method may form the absorption layer on the current confinement layer by causing material growth of Si, GeSi, Ge or a III-V material on the current confinement layer. In one embodiment, causing material growth may include causing an epitaxial process by RPCVD, UHV/CVD or MOCVD.

BRIEF DESCRIPTION OF THE DRAWINGS

The accompanying drawings are included to provide a further understanding of the present disclosure, and are incorporated in and constitute a part of this specification. The drawings illustrate embodiments of the present disclosure and, together with the description, serve to explain the principles of the present disclosure. The drawings may not necessarily be in scale so as to better present certain features of the illustrated subject matter.

DETAILED DESCRIPTION OF THE PREFERRED EMBODIMENTS

Overview

In conventional photodiode devices, the conductive currents that cross the interface between the photonic device and substrate include at least the following: the current under the open area (optical sensitive area in photodiodes or photonic devices), the dark current under the blocked area without photonic illumination, and the leakage currents from sidewall. Not all of these currents have a positive contribution for photonic devices: for example, for photodiode, the region where the light is directly illuminated on (e.g., the central region) is useful for collecting optical signal and the rest parts are useless. The dark current generated in blocked area and the leakage current from sidewall do not have a positive contribution for photonic devices and, thus, need to be reduced or otherwise minimized significantly to improve the signal-to-noise ratio of devices, e.g., Ge/Si photonic devices such as photodiode, lasers and modulators. Accordingly, embodiments of a structure of the present disclosure include a current confinement layer that aids the reduction of dark current.

Illustrative Examples

Figure 1:
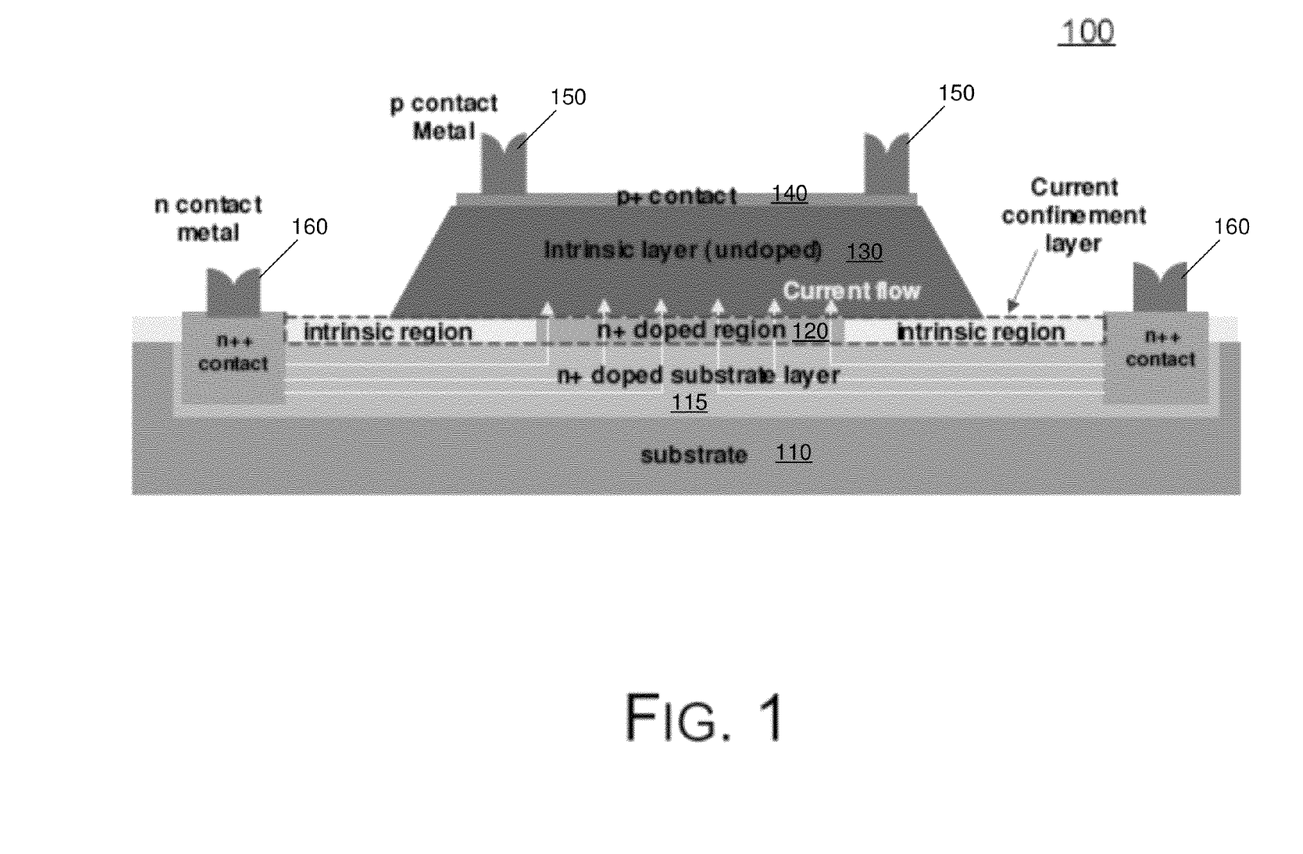
FIG. 1 is a structural diagram of a photodiode device with current confinement layer in accordance with an embodiment of the present disclosure.

FIG. 1 illustrates a photodiode device 100 with current confinement layer in accordance with an embodiment of the present disclosure.

As shown in FIG. 1, the photodiode device 100 includes a substrate 110, a current confinement layer 120 disposed on the substrate 110, an absorption layer 130, which may be an intrinsic layer, disposed on the current confinement layer 120, and an electrical contact layer 140 disposed on the absorption layer 130 for electrical connection. One or more electrical contacts 150 of a first polarity (e.g., p contacts), made of metal for example, may be disposed on the electrical contact layer 140, which is doped with dopants of the first polarity. The substrate 110 may be or made from, for example, a bulk silicon (Si) wafer or a silicon-on-insulator (SOI) wafer. The substrate 110 is heavily doped, and thus has a doped layer 115 doped with dopants of a second polarity opposite the first polarity (e.g., n+ doped substrate layer) near its top surface on which the current confinement layer 120 is disposed. One or more electrical contacts 160 of the second polarity (e.g., n++ contacts) may be located on the periphery of, and in contact with, the doped layer 115 and the current confinement layer 120.

The current confinement layer 120 may be formed by, for example, growth of Si, GeSi, Ge or other III-V material on the substrate 110. After growth, the current confinement layer 120 is doped in a pattern. For example, a select portion in the current confinement layer 120 (e.g., the central region thereof as shown in FIG. 1) is doped with higher concentration than other portions of the current confinement layer 120 (e.g., regions of the current confinement layer 120 surrounding the central region thereof). That is, the central region of the current confinement layer 120 may be doped while the regions surrounding the central region of the current confinement layer 120 may be intrinsic regions.

The absorption layer 130 is configured to collect optical signal, and may be formed by, for example, growth of Si, GeSi, Ge or other III-V material on the current confinement layer 120.

Different from conventional designs such as that shown in FIG. 7, the photodiode device 100 includes the current confinement layer 120 for reducing dark current. The current confinement layer 120 is not uniformly doped and has some pattern. As a result, most of the conductive currents will be confined to a region inside the heavily doped region of the current confinement layer 120 because of resistance differences.

In one embodiment, the material growth may include epitaxial processes done by reduced-pressure chemical vapor deposition (RPCVD), ultra-high vacuum chemical vapor deposition (UHV/CVD) or metal oxide chemical vapor deposition (MOCVD).

In one embodiment, the heavily doped region of the current confinement layer 120 may have a doping concentration from about $1\times10^{16}$ to about $1\times10^{20}/cm^3$. Moreover, the intrinsic regions of the current confinement layer 120 may have a doping concentration has a doping concentration less than $1\times10^{16}/cm^3$.

In one embodiment, the photodiode device 100 may be either a normal incident photodiode or a waveguide photodiode.

Figure 2:
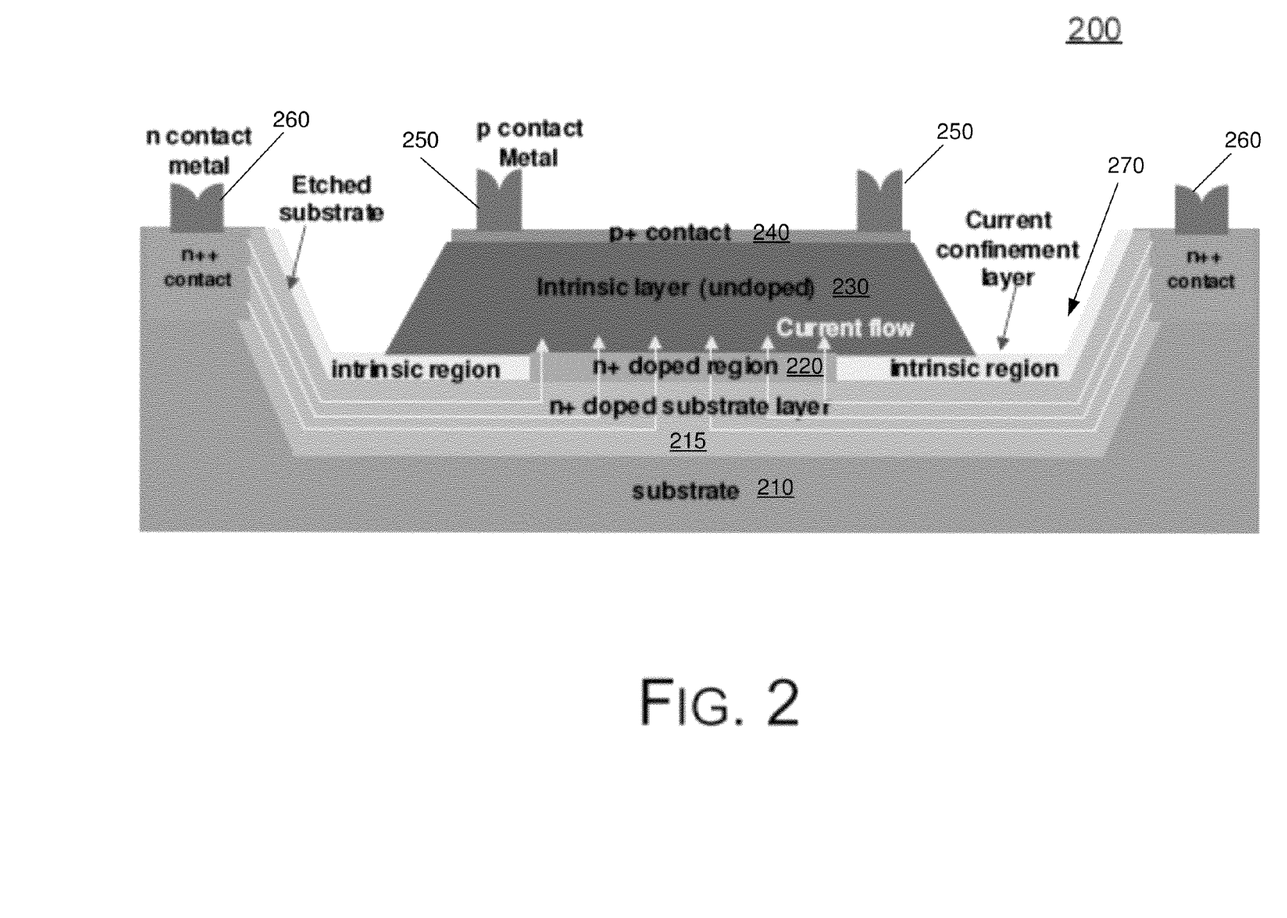
FIG. 2 is a structural diagram of a photodiode device with current confinement layer in accordance with another embodiment of the present disclosure.

FIG. 2 illustrates a photodiode device 200 with current confinement layer in accordance with another embodiment of the present disclosure.

As shown in FIG. 2, the photodiode device 200 includes a substrate 210, a current confinement layer 220 disposed on the substrate 210, an absorption layer 230, which may be an intrinsic layer, disposed on the current confinement layer 220, and an electrical contact layer 240 disposed on the absorption layer 230 for electrical connection. One or more electrical contacts 250 of the first polarity (e.g., p contacts), made of metal for example, may be disposed on the electrical contact layer 240, which is doped with dopants of the first polarity. The substrate 210 may be or made from, for example, a bulk Si wafer or a SOI wafer. The substrate 210 is etched first to form a recess 270 on the top side thereof, as shown in FIG. 2, and then heavily doped to form a doped layer 215 doped with dopants of the second polarity opposite the first polarity (e.g., n+ doped substrate layer) near its top surface on which the current confinement layer 220 is disposed. The recess 270 on the top side of the substrate 210 (i.e., the side of the substrate 110 on which the rest of the layers of the photodiode device 200 are disposed) allows the top surface, i.e., the electrical contact layer 240, to be substantially or at least approximately flush with peripheral regions of the substrate 210 that are not recessed, such as where one or more electrical contacts 260 of the second polarity (e.g., n++ contacts) are located. The one or more electrical contacts 260 may be in contact with the doped layer 215 of the substrate 210 but not in contact with the current confinement layer 220.

The current confinement layer 220 may be formed by, for example, growth of Si, GeSi, Ge or other III-V material on the substrate 210. After growth, the current confinement layer 220 is doped in a pattern. For example, a select portion in the current confinement layer 220 (e.g., the central region thereof as shown in FIG. 2) is doped with higher concentration than other portions of the current confinement layer 220 (e.g., regions of the current confinement layer 220 surrounding the central region thereof). That is, the central region of the current confinement layer 220 may be doped while the regions surrounding the central region of the current confinement layer 220 may be intrinsic regions.

The absorption layer 230 is configured to collect optical signal, and may be formed by, for example, growth of Si, GeSi, Ge or other III-V material on the current confinement layer 220.

Different from conventional designs such as that shown in FIG. 7, the photodiode device 200 includes the current confinement layer 220 for reducing dark current. The current confinement layer 220 is not uniformly doped and has some pattern. As a result, most of the conductive currents will be confined to a region inside the heavily doped region of the current confinement layer 220 because of resistance differences.

In one embodiment, the material growth may include epitaxial processes done by RPCVD, UHV/CVD or MOCVD.

In one embodiment, the heavily doped region of the current confinement layer 220 may have a doping concentration from about $1\times10^{16}$ to about $1\times10^{20}$/cm$^3$. Moreover, the intrinsic regions of the current confinement layer 220 may have a doping concentration has a doping concentration less than $1\times10^{16}$/cm$^3$.

In one embodiment, the photodiode device 200 may be either a normal incident photodiode or a waveguide photodiode.

Figure 3:
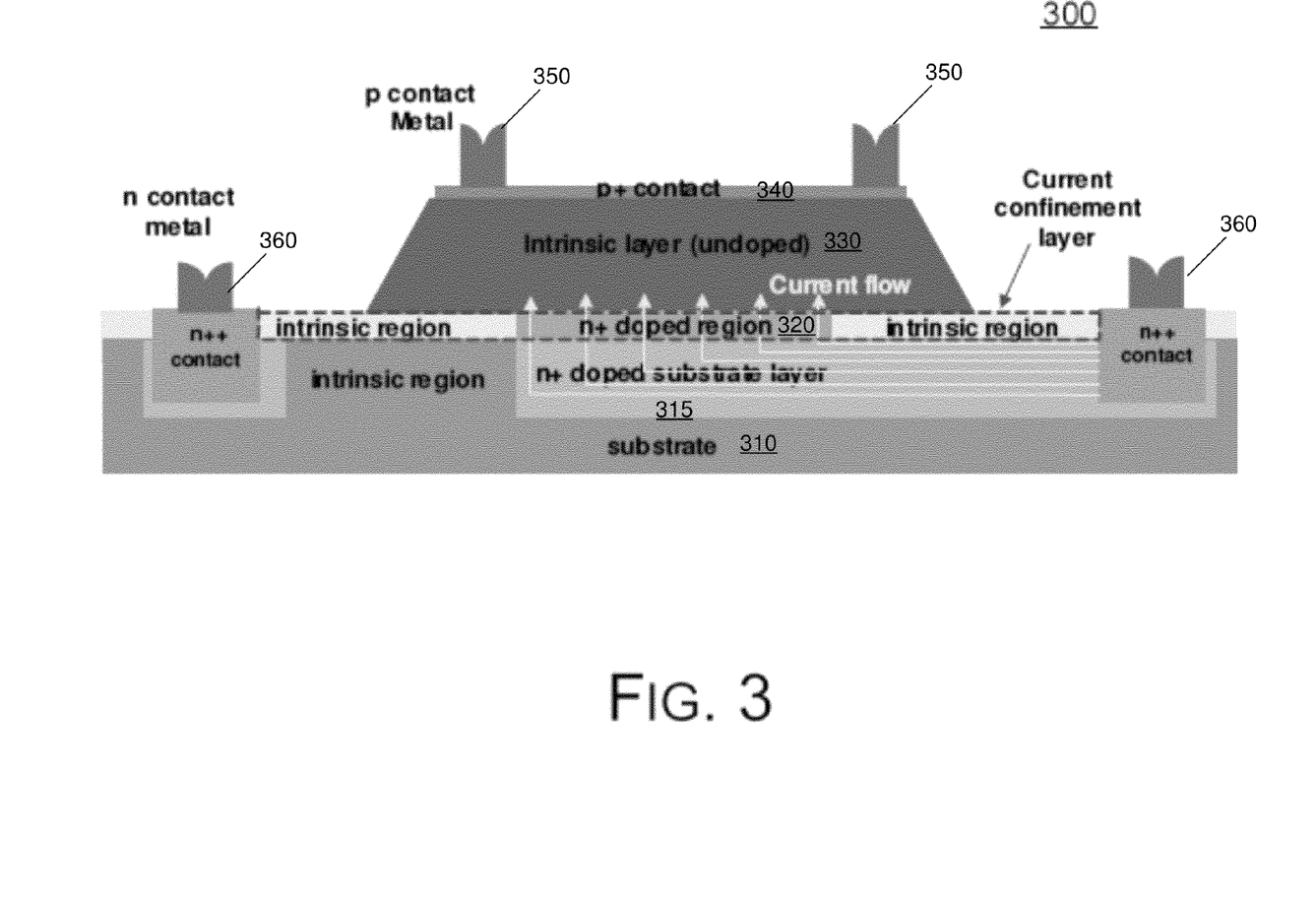
FIG. 3 is a structural diagram of a photodiode device with current confinement layer and patterned substrate in accordance with an embodiment of the present disclosure.

FIG. 3 illustrates a photodiode device 300 with current confinement layer and patterned substrate in accordance with an embodiment of the present disclosure.

As shown in FIG. 3, the photodiode device 300 includes a substrate 310, a current confinement layer 320 disposed on the substrate 310, an absorption layer 330, which may be an intrinsic layer, disposed on the current confinement layer 320, and an electrical contact layer 340 disposed on the absorption layer 330 for electrical connection. One or more electrical contacts 350 of the first polarity (e.g., p contacts), made of metal for example, may be disposed on the electrical contact layer 340, which is doped with dopants of the first polarity. The substrate 310 may be or made from, for example, a bulk Si wafer or a SOI wafer. The substrate 310 is heavily doped, and thus has a doped layer 315 doped with dopants of the second polarity opposite the first polarity (e.g., n+ doped substrate layer) near its top surface on which the current confinement layer 320 is disposed. One or more electrical contacts 360 of the second polarity (e.g., n++ contacts) may be located on the periphery of, and in contact with, the doped layer 315 and the current confinement layer 320.

One major difference between the photodiode device 300 and the photodiode device 100 is that the doping pattern of the doped layer 315 of the substrate 310 is different from the doping pattern of the doped layer 115 of the substrate 110. For example, as shown in FIG. 3, the doping layer 315 may be patterned such that the doping layer 315 has a non-uniform distribution of doping concentration in the area beneath the current confinement layer 320.

The current confinement layer 320 may be formed by, for example, growth of Si, GeSi, Ge or other III-V material on the substrate 310. After growth, the current confinement layer 320 is doped in a pattern. For example, a select portion in the current confinement layer 320 (e.g., the central region thereof as shown in FIG. 3) is doped with higher concentration than other portions of the current confinement layer 320 (e.g., regions of the current confinement layer 320 surrounding the central region thereof). That is, the central region of the current confinement layer 320 may be doped while the regions surrounding the central region of the current confinement layer 320 may be intrinsic regions.

The absorption layer 330 is configured to collect optical signal, and may be formed by, for example, growth of Si, GeSi, Ge or other III-V material on the current confinement layer 320.

Different from conventional designs such as that shown in FIG. 7, the photodiode device 300 includes the current confinement layer 320 for reducing dark current. The current confinement layer 320 is not uniformly doped and has some pattern. As a result, most of the conductive currents will be confined to a region inside the heavily doped region of the current confinement layer 320 because of resistance differences.

In one embodiment, the material growth may include epitaxial processes done by RPCVD, UHV/CVD or MOCVD.

In one embodiment, the heavily doped region of the current confinement layer 320 may have a doping concentration from about $1\times10^{16}$ to about $1\times10^{20}$/cm$^3$. Moreover, the intrinsic regions of the current confinement layer 320 may have a doping concentration has a doping concentration less than $1\times10^{16}$/cm$^3$.

In one embodiment, the photodiode device 300 may be either a normal incident photodiode or a waveguide photodiode.

As shown in FIG. 3, the dopant distribution of the doped layer 315 of the substrate 310 may be patterned. In one embodiment, the patterned and doped substrate 310 may be formed by implantation on an intrinsic substrate, such as a bulk Si wafer or a SOI wafer, for example.

In one embodiment, the heavily doped region of the doped layer 315 the substrate 310 may have a doping concentration from $1\times10^{16}$ to about $1\times10^{20}$/cm$^3$. Moreover, the intrinsic regions of the substrate 310 may have a doping concentration has a doping concentration less than $1\times10^{16}$/cm$^3$.

Figure 4:
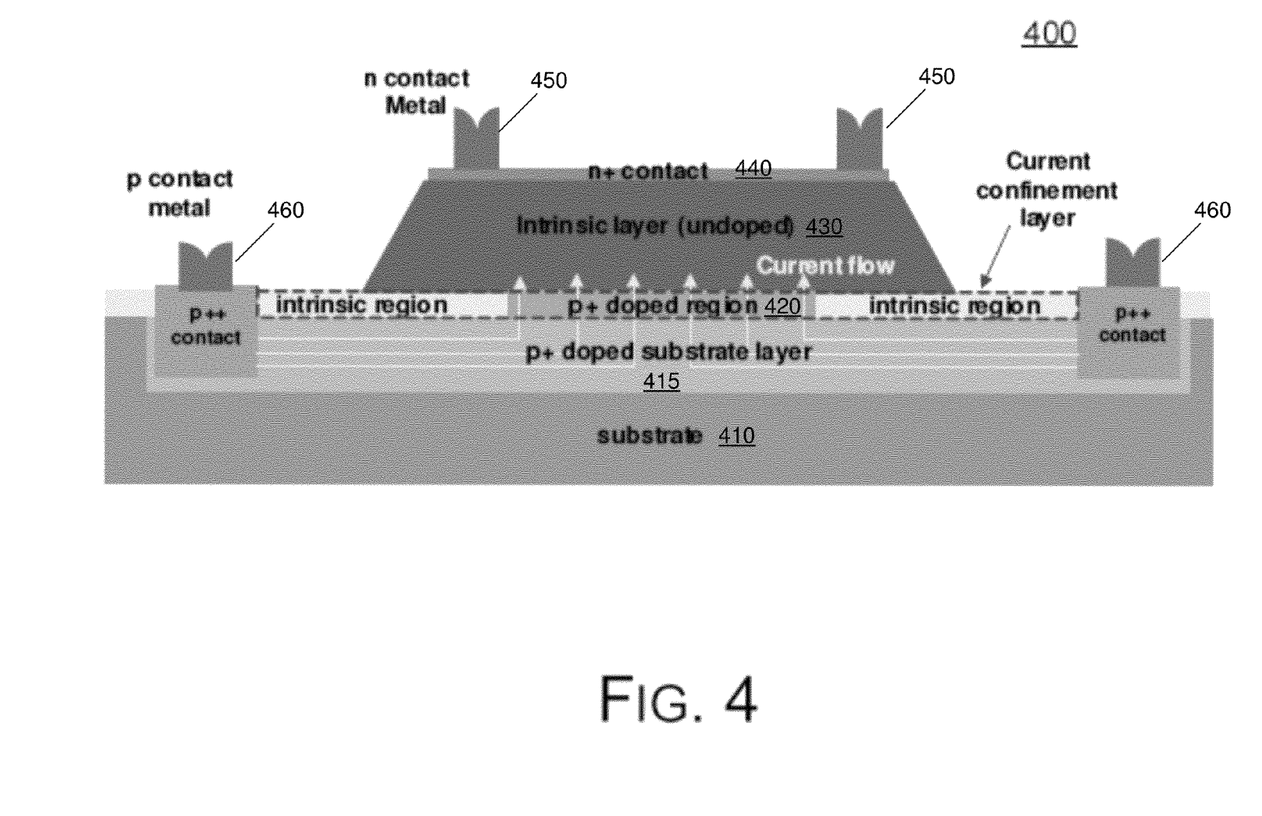
FIG. 4 is a structural diagram of a laser device with current confinement layer in accordance with an embodiment of the present disclosure.

FIG. 4 illustrates a laser device 400 with current confinement layer in accordance with an embodiment of the present disclosure.

Other than photodiodes, the novel structure of the present disclosure can be applied to laser for reducing threshold current, shown in FIG. 4. In one embodiment, the laser device 400 may be either an edge-emitting laser or a vertical cavity surface emitting laser (VCSEL). That is, the laser device 400 may be a laser device as well as a photodiode device.

As shown in FIG. 4, the laser device 400 includes a substrate 410, a current confinement layer 420 disposed on the substrate 410, an active layer 430, which may be an intrinsic or heavily doped layer (e.g., n+ doped), disposed on the current confinement layer 420, and an electrical contact layer 440 disposed on the active layer 430 for electrical connection. One or more electrical contacts 450 of the second polarity (e.g., n contacts), made of metal for example, may be disposed on the electrical contact layer 440, which is doped with dopants of the second polarity. The substrate 410 may be or made from, for example, a bulk Si wafer or a SOI wafer. The substrate 410 is heavily doped, and thus has a doped layer 415 doped with dopants of the first polarity opposite the second polarity (e.g., p+ doped substrate layer) near its top surface on which the current confinement layer 420 is disposed. One or more electrical contacts 460 of the first polarity (e.g., p++ contacts) may be located on the periphery of, and in contact with, the doped layer 415 and the current confinement layer 420.

The current confinement layer 420 may be formed by, for example, growth of Si, GeSi, Ge or other III-V material on the substrate 410. After growth, the current confinement layer 420 is doped in a pattern. For example, a select portion in the current confinement layer 420 (e.g., the central region thereof as shown in FIG. 4) is doped with higher concentration than other portions of the current confinement layer 420 (e.g., regions of the current confinement layer 420 surrounding the central region thereof). That is, the central region of the current confinement layer 420 may be doped while the regions surrounding the central region of the current confinement layer 420 may be intrinsic regions.

The active layer 430 is configured to generate light, and may be formed by, for example, growth of Si, GeSi, Ge or other III-V material on the current confinement layer 420.

Different from conventional designs such as that shown in FIG. 7, the laser device 400 includes the current confinement layer 420 for reducing threshold current. The current confinement layer 420 is not uniformly doped and has some pattern. As a result, most of the conductive currents will be confined to a region inside the heavily doped region of the current confinement layer 420 because of resistance differences.

In one embodiment, the material growth may include epitaxial processes done by RPCVD, UHV/CVD or MOCVD.

In one embodiment, the heavily doped region of the current confinement layer 420 may have a doping concentration from about $1\times10^{16}$ to about $1\times10^{20}/cm^3$. Moreover, the intrinsic regions of the current confinement layer 420 may have a doping concentration has a doping concentration less than $1\times10^{16}/cm^3$.

In one embodiment, the laser device 400 may be either an edge-emitting laser or a vertical cavity surface emitting laser (VCSEL).

Figure 5:
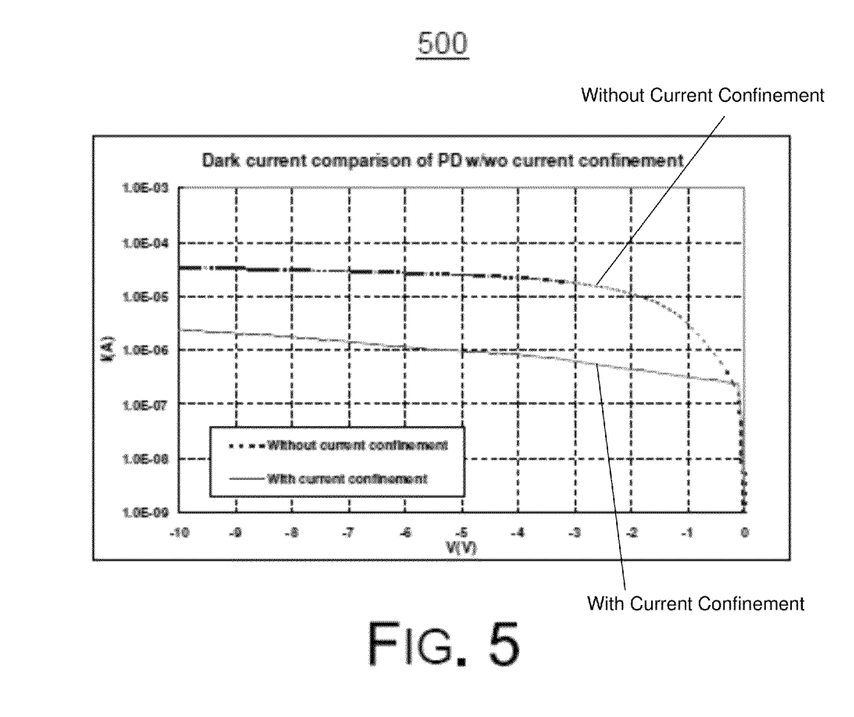
FIG. 5 is a chart showing photodiode dark current with and without the current confinement layer in accordance with another embodiment of the present disclosure.
Figure 6:
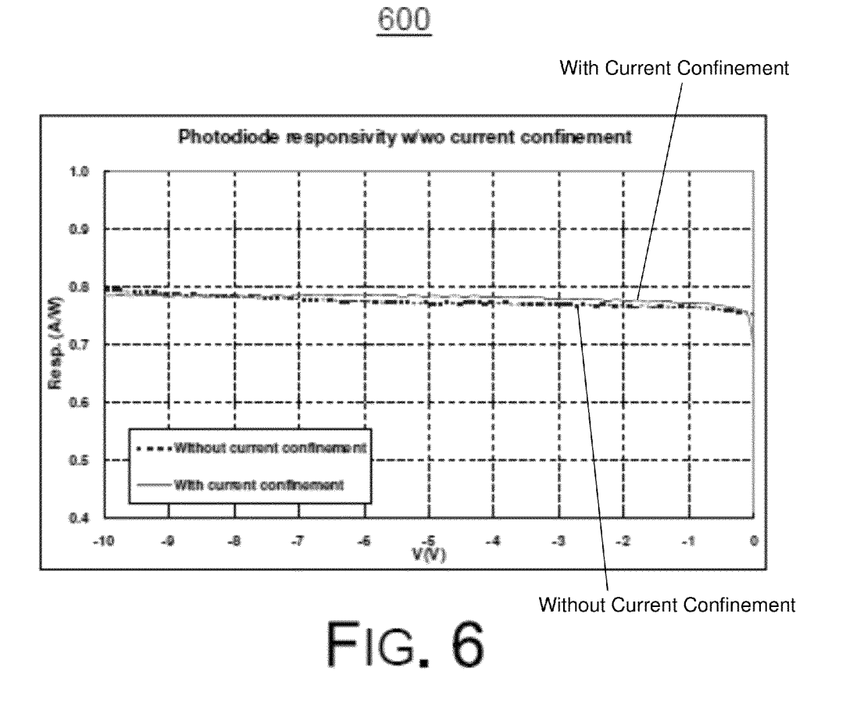
FIG. 6 is a chart showing photodiode responsivity with and without the current confinement layer in accordance with another embodiment of the present disclosure.

FIG. 5 is a chart 500 showing photodiode dark current with and without the current confinement layer in accordance with another embodiment of the present disclosure. FIG. 6 is a chart 600 showing photodiode responsivity with and without the current confinement layer in accordance with another embodiment of the present disclosure.

As shown in FIGS. 5 and 6, the novel structure of each of the photodiode device 100, the photodiode device 200, the photodiode device 300 and the laser device 400, which includes a current confinement layer, reduces dark current without negatively impacting (e.g., causing loss of) the responsivity of the device.

Additional Note

Although some embodiments are disclosed above, they are not intended to limit the scope of the present disclosure. It will be apparent to those skilled in the art that various modifications and variations can be made to the disclosed embodiments of the present disclosure without departing from the scope or spirit of the present disclosure. In view of the foregoing, the scope of the present disclosure shall be defined by the following claims and their equivalents.

What is claimed is:

1. A device, comprising:
a substrate;
a current confinement layer disposed on the substrate, the current confinement layer being doped in a pattern and configured to reduce dark current in the device;
an absorption layer disposed on the current confinement layer; and
an electrical contact layer disposed on the absorption layer and doped with dopants of a first polarity.

2. The device of claim 1, wherein a first portion of the current confinement layer is doped with dopants of a second polarity opposite the first polarity, and wherein a second portion of the current confinement layer surrounding the first portion comprises an intrinsic region.

3. The device of claim 2, wherein the first portion of the current confinement layer is doped with dopants of the second polarity with a doping concentration from about $1\times10^{16}$ to about $1\times10^{20}/cm^3$.

4. The device of claim 2, wherein the second portion of the current confinement layer is doped with dopants of the second polarity with a doping concentration has a doping concentration less than $1\times10^{16}/cm^3$.

5. The device of claim 1, wherein a first primary side of the substrate includes a recess, and wherein the current confinement is disposed on the first primary side of the substrate in the recess.

6. The device of claim 5, wherein an exposed surface of the electrical contact layer is approximately flush with a portion of the first primary side of the substrate that is not recessed.

7. The device of claim 1, wherein the substrate comprises a bulk Si wafer a silicon-on-insulator (SOI) wafer.

8. The device of claim 1, wherein a region on a side of the substrate on which the current confinement layer is disposed is doped with dopants of a second polarity opposite the first polarity to form a doped layer in the substrate.

9. The device of claim 1, wherein the current confinement layer comprises material growth of Si, GeSi, Ge or a III-V material on the substrate.

10. The device of claim 1, wherein the absorption layer comprises material growth of Si, GeSi, Ge or a III-V material on the current confinement layer.

11. The device of claim 1, wherein the device comprises a normal incident photodiode or a waveguide photodiode.

12. The device of claim 1, wherein the device comprises an edge-emitting laser or a vertical cavity surface emitting laser (VCSEL).

13. A method of fabrication of a device, comprising:
forming a current confinement layer on a substrate, the current confinement layer being doped in a pattern and configured to reduce dark current in the device;
forming an absorption layer on the current confinement layer; and
forming an electrical contact layer on the absorption layer and doped with dopants of a first polarity.

14. The method of claim 13, wherein forming the current confinement layer on the substrate comprises doping the current confinement layer such that a first portion of the current confinement layer with dopants of a second polarity opposite the first polarity.

15. The method of claim 14, wherein the first portion of the current confinement layer is doped with dopants of the second polarity with a doping concentration from about $1\times10^{16}$ to about $1\times10^{20}/cm^3$.

16. The method of claim 14, wherein a second portion of the current confinement layer surrounding the first portion is doped with dopants of the second polarity with a doping concentration has a doping concentration less than $1 \times 10^{16}/cm^3$.

17. The method of claim 13, further comprising:
   etching a recess on a first primary side of the substrate,
   wherein forming the current confinement layer on the substrate comprises forming the current confinement layer on the first primary side of the substrate in the recess.

18. The method of claim 13, wherein the substrate comprises a bulk Si wafer a silicon-on-insulator (SOI) wafer.

19. The method of claim 13, further comprises doping a region on a side of the substrate on which the current confinement layer is disposed with dopants of a second polarity opposite the first polarity to form a doped layer in the substrate.

20. The method of claim 13, wherein forming the current confinement layer on the substrate comprises causing material growth of Si, GeSi, Ge or a III-V material on the substrate.

21. The method of claim 20, wherein causing material growth comprises causing an epitaxial process by reduced-pressure chemical vapor deposition (RPCVD), ultra-high vacuum chemical vapor deposition (UHV/CVD) or metal oxide chemical vapor deposition (MOCVD).

22. The method of claim 13, wherein forming the absorption layer on the current confinement layer comprises causing material growth of Si, GeSi, Ge or a III-V material on the current confinement layer.

23. The method of claim 22, wherein causing material growth comprises causing an epitaxial process by reduced-pressure chemical vapor deposition (RPCVD), ultra-high vacuum chemical vapor deposition (UHV/CVD) or metal oxide chemical vapor deposition (MOCVD).

\* \* \* \* \*